(12) United States Patent
Bottomley et al.

(10) Patent No.: US 7,026,804 B2
(45) Date of Patent: Apr. 11, 2006

(54) SAMPLE AND HOLD CIRCUIT

(75) Inventors: Andrew Michael Bottomley, San Diego, CA (US); Didier Serge Sagan, San Diego, CA (US)

(73) Assignee: Zarlink Semiconductor (U.S.) Inc., San Diego, CA (US)

( * ) Notice: Subject to any disclaimer, the term of this patent is extended or adjusted under 35 U.S.C. 154(b) by 101 days.

(21) Appl. No.: 10/183,324

(22) Filed: Jun. 25, 2002

(65) Prior Publication Data

US 2003/0234641 A1 Dec. 25, 2003

(51) Int. Cl.
*G01R 13/34* (2006.01)

(52) U.S. Cl. .................................... 324/76.42
(58) Field of Classification Search ............. 324/76.42; 327/94

See application file for complete search history.

(56) References Cited

U.S. PATENT DOCUMENTS

| | | | | |
|---|---|---|---|---|
| 6,052,000 | A * | 4/2000 | Nagaraj | 327/94 |
| 6,069,502 | A * | 5/2000 | Preslar et al. | 327/94 |
| 6,191,639 | B1 * | 2/2001 | Rau | 327/379 |
| 6,566,934 | B1 * | 5/2003 | Goren et al. | 327/337 |
| 2003/0020530 | A1 * | 1/2003 | Lee et al. | 327/379 |

FOREIGN PATENT DOCUMENTS

| | | | |
|---|---|---|---|
| DE | 24 41 192 A1 | 3/1976 | |
| JP | 60154400 A * | 8/1985 | |
| JP | 60182100 | 9/1985 | |
| JP | 01049198 | 2/1989 | |
| JP | 01098196 A * | 4/1989 | |
| JP | 02146194 A * | 6/1990 | |

OTHER PUBLICATIONS

International Search Report for PCT/US03/18236, Oct. 7, 2003.

\* cited by examiner

*Primary Examiner*—Vincent Q. Nguyen
(74) *Attorney, Agent, or Firm*—Knobbe Martens Olson & Bear LLP (57) ABSTRACT

A method and system for sampling an analog signal that minimizes perturbations caused by noise. In one embodiment, the sample and hold circuit includes a plurality of switches in series between the sampled source and a hold capacitor. A resistor is located in parallel with the first switch. The two switches are controlled so as to provide three signal paths between the hold capacitor and the sampled signal. The first signal path is a closed circuit between the charge capacitor and the sampled signal. This path occurs during a first phase of operation for the sample and hold circuit. During a second phase of operation, the first switch is opened which sends any current loss from the capacitor to path through the resistor. The high resistance provided by the resistor minimizes this current loss. The third signal path occurs when the second switch is opened which present an open circuit between the capacitor and the sampled signal. During the transition from the second phase to the third phase, any current loss due to noise passes through the resistor and thus minimizes the voltage loss across the hold capacitor. Another embodiment of the sample and hold circuit only operates between a first and a second phase.

2 Claims, 7 Drawing Sheets

SAMPLE AND HOLD CIRCUIT

BACKGROUND OF THE INVENTION

1. Field of the Invention

This invention relates to circuits and methods for sampling the level of a signal and holding the sampled value constant for a pre-determined period of time. This invention particularly relates to circuits and methods that maintain the integrity of the sampled value when supply and substrate noise are present.

2. Description of the Related Art

Sample and hold circuits typically employ a switching device for periodically connecting a capacitor to an input signal to be sampled. While the capacitor is connected to the input signal, it will charge or discharge to the voltage level of the input signal. Once the switching device is disconnected, the capacitor will hold that voltage level.

In some cases, noise can render the sampled signal inaccurate for subsequent analog-to-digital conversion. Sources of noise can include perturbations on an application specific integrated circuit (ASIC) ground rail caused by ASIC digital activity.

One approach to minimize the impact of noise on the sampled signal is to incorporate complex differential sample and hold systems. However, the addition of such systems increases the cost and complexity of the sample and hold circuit. Further, such complex differential sample and hold systems require larger areas and consume additional current for their operation.

SUMMARY OF THE INVENTION

The systems and methods of the present invention have several features, no single one of which is solely responsible for its desirable attributes. Without limiting the scope of this invention as expressed by the claims which follow, its more prominent features will now be discussed briefly. After considering this discussion, and particularly after reading the section entitled "Detailed Description of the Preferred Embodiments" one will understand how the features of this invention provide several advantages over traditional sample and hold circuits.

One aspect is a method of sampling an external analog signal on a microchip. The method includes receiving the external analog signal at a hold capacitor on the microchip via an electrical path that includes a plurality of switches, charging the hold capacitor with the external analog signal during a first sample phase, connecting an electrical resistance in the electrical path during a second sample phase, and isolating the hold capacitor from the external analog signal during a hold phase, whereby discharge from the hold capacitor is reduced.

Another aspect is a system for a sample and hold circuit that comprises a first switch comprising two terminals, one of which is connected to a signal input line, a second switch comprising two terminals, one of which is connected to the other terminal of the first switch, and an operational amplifier having an input terminal connected to the other terminal of the second switch. The system further includes a resistor interposed between the signal input line and the other terminal of the first switch, a hold capacitor interposed between the input terminal of the operational amplifier and a constant-potential line, and a controller configured to operate said first and second switches during a first phase, a second phase, and a third phase. During the first phase the hold capacitor samples a voltage associated with the signal input line, during the second phase the first switch presents an open circuit across the resistor, and during the third phase the second switch presents an open circuit to the hold capacitor.

Another aspect is a method of reducing a voltage loss caused by ground voltage variations between an integrated circuit and a printed circuit board, wherein a sample signal from the printed circuit board is sampled on the integrated circuit. The method comprises charging a hold capacitor during a first phase of a sample process and connecting an electrical resistance between the sample signal and the hold capacitor during a second phase of the sample process.

Another aspect is a system for a sample and hold circuit which comprises a hold capacitor configured to maintain an input voltage when electrically disconnected from an input signal source and a plurality of switches connected in series and located between the hold capacitor and the input signal source, and configured to vary an impedance between the input signal source and the hold capacitor during a plurality of phases.

Still another aspect is a multi-phase method for sampling a voltage. The method comprises charging a capacitor with a flow of current from the voltage during a first phase, impeding a reverse flow of the current from the capacitor during a second phase, and isolating the capacitor from the voltage during a hold phase.

Still another aspect is a sample and hold circuit that includes a plurality of switches configured to reduce a voltage loss across a hold capacitor due to ground bounce.

Yet another aspect is a circuit configured to maintain an input signal. The circuit comprises a first switch connected to receive the input signal, a resistor located in parallel with the first switch, a second switch in series with the first switch, a hold capacitor in communication with the second switch and configured to sample the input signal. The circuit further includes a logic circuit configured to periodically route the input signal to the hold capacitor via the first and second switches during a first sample phase, route the input signal to the hold capacitor via the resistor and the second switch during a second sample phase, and isolate the hold capacitor from the input signal during a hold phase.

Yet another aspect is a sample and hold circuit comprising an input port, a hold capacitor, and means for connecting an electrical resistance between the input port and the hold capacitor.

An additional aspect is a sample and hold circuit configured to reduce the impact of ground bounce. The sample and hold circuit includes a first stage comprising a first switch connected in parallel with a resistor, a second stage comprising a second switch, and connected in series with the first stage, and a hold capacitor connected in series with the first stage and the second stage.

DETAILED DESCRIPTION OF THE PREFERRED EMBODIMENTS

Preferred embodiments of the present invention will now be described with reference to the accompanying figures, wherein like numerals refer to like elements throughout. The terminology used in the description presented herein is not intended to be interpreted in any limited or restrictive manner simply because it is being utilized in conjunction with a detailed description of certain specific preferred embodiments of the present invention.

Figure 1:
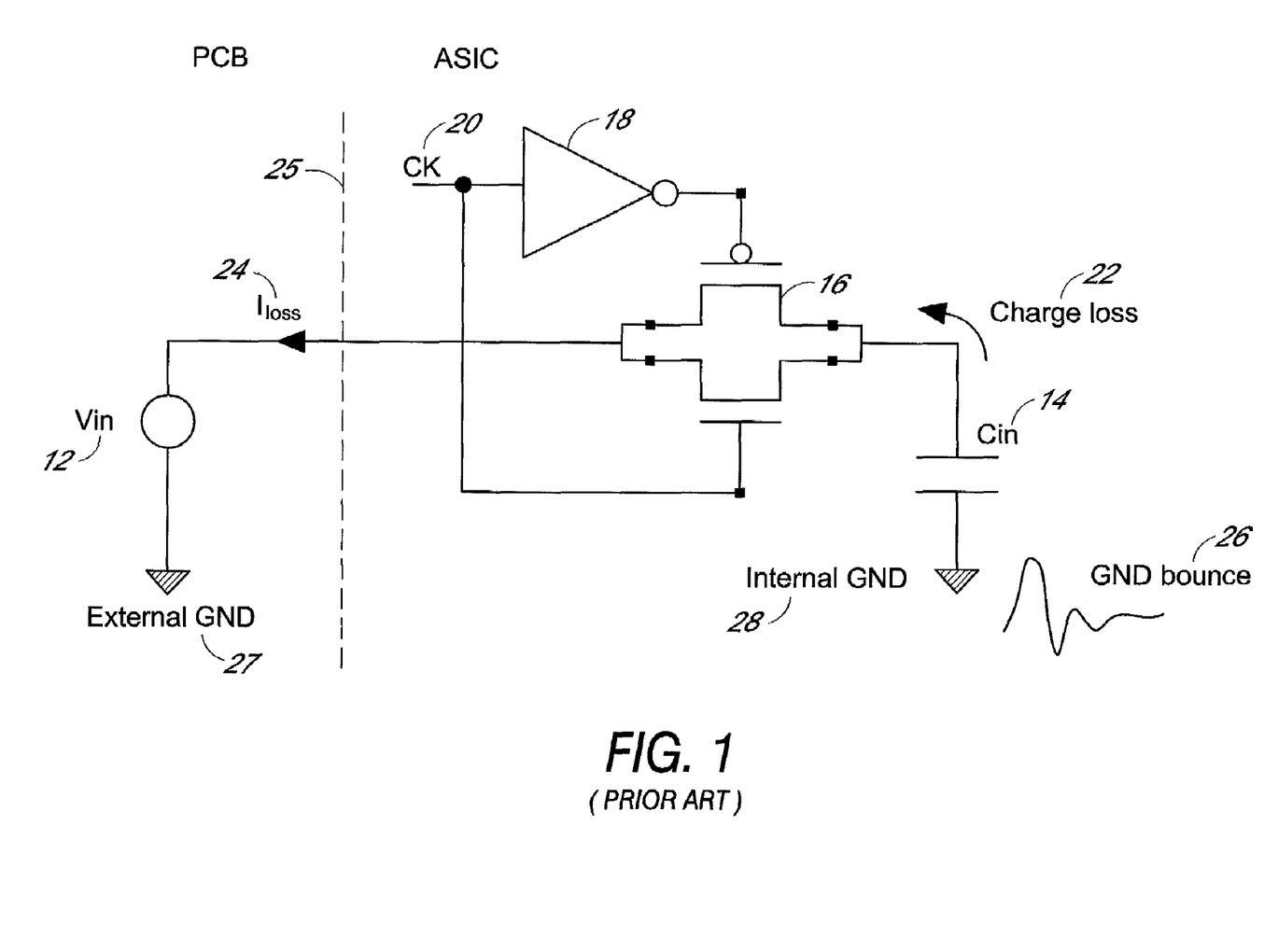
FIG. 1 is a block diagram of a conventional switched capacitor structure employed as a sample and hold circuit.

A representative conventional switched capacitor input structure is illustrated schematically in FIG. 1. In the switched capacitor input structure of FIG. 1, an input voltage $V_{in}$ 12 is applied to an input capacitor 14 through a transistor switch 16. This sampling occurs during a "sample phase" of the process, during which the capacitor charges until the voltage across the capacitor rises to the input voltage level. During a hold phase of the process, the switch 16 changes state to disconnect the input voltage $V_{in}$ 12 from the capacitor 14. The voltage on capacitor 14 is then sensed by a next stage of circuitry (not shown).

In the traditional sample or hold circuit of FIG. 1, the switch 16 is used to capture the input voltage on the input capacitor 14. In many environments, the ground reference connected to the capacitor will experience a transient level fluctuation at the same time that the switch 16 is opened. This can cause charge to be lost from the input capacitor 14 into the input source prior to voltage sensing. This charge loss 22 or $I_{loss}$ 24 are shown in FIG. 1 as flowing from the input capacitor 14 to $V_{in}$ 12. When this occurs, the sampled voltage across the capacitor 14 becomes corrupted. This corruption can lead to an erroneous reading during a subsequent analog-to-digital conversion of the sampled signal by the next stage of circuitry.

Any type of switch design may be used between the source and the hold capacitor, but typically, switch 16 includes a first transistor and a second transistor. The first transistor and the second transistor are both configured to turn on and off in response to a clock signal 20. A sampling clock (not shown) provides the clock signal 20 to the two transistors. In one embodiment, one transistor is a nmos transistor, and the second transistor is a pmos transistor. In this embodiment, an inverter is provided to invert the incoming clock signal 20 for one of the two transistors so as to allow both the pmos and nmos transistors to turn off and on in unison in response to clock signal 20. Thus, both transistors turn on and off together in response to the clock signal.

Alternatively, the two transistors could both be n type or p type such that the inverter is not required.

An exemplary configuration includes a sample and hold circuit located on an integrated circuit while the input signal to be sampled originates from a printed circuit board (PCB) on which the integrated circuit is mounted. This configuration is shown in FIG. 1. Since the sample and hold circuit is located on, and is locally grounded within the body of the integrated circuit, it is considered to be on-chip. In contrast, the input signal from the PCB grounds directly to the PCB and is considered to be off-chip. Dashed line 25 signifies the transition between the on-chip sample and hold circuit and the off-chip input signal. While the local ground of the integrated circuit eventually grounds to the PCB or to a common ground shared with the PCB, a small impedance between the local ground of the integrated circuit and the PCB or common ground can result from this off-chip/on-chip arrangement. This impedance allows transient ground fluctuations or noise between the sample and hold circuit and the input signal. Ground bounce 26 represents these transient fluctuations in ground potential between the on-chip sample and hold circuit and the off-chip input voltage.

Ground bounce 26 is a measure of a voltage difference between the external ground 27 and the internal ground 28 over time. As shown in FIG. 1, an off-chip external ground 27 is associated with the $V_{in}$ 12 while an on-chip internal ground 28 is associated with input capacitor $C_{in}$ 14. This configuration can increase the potential for noise to cause charge loss 22 from the input $C_{in}$ 14 during the transition from the sample phase to the hold phase. The sample and hold circuits herein disclosed have particular applicability where there is some impedance between the sample and hold circuit and the input signal ground.

Figure 2:
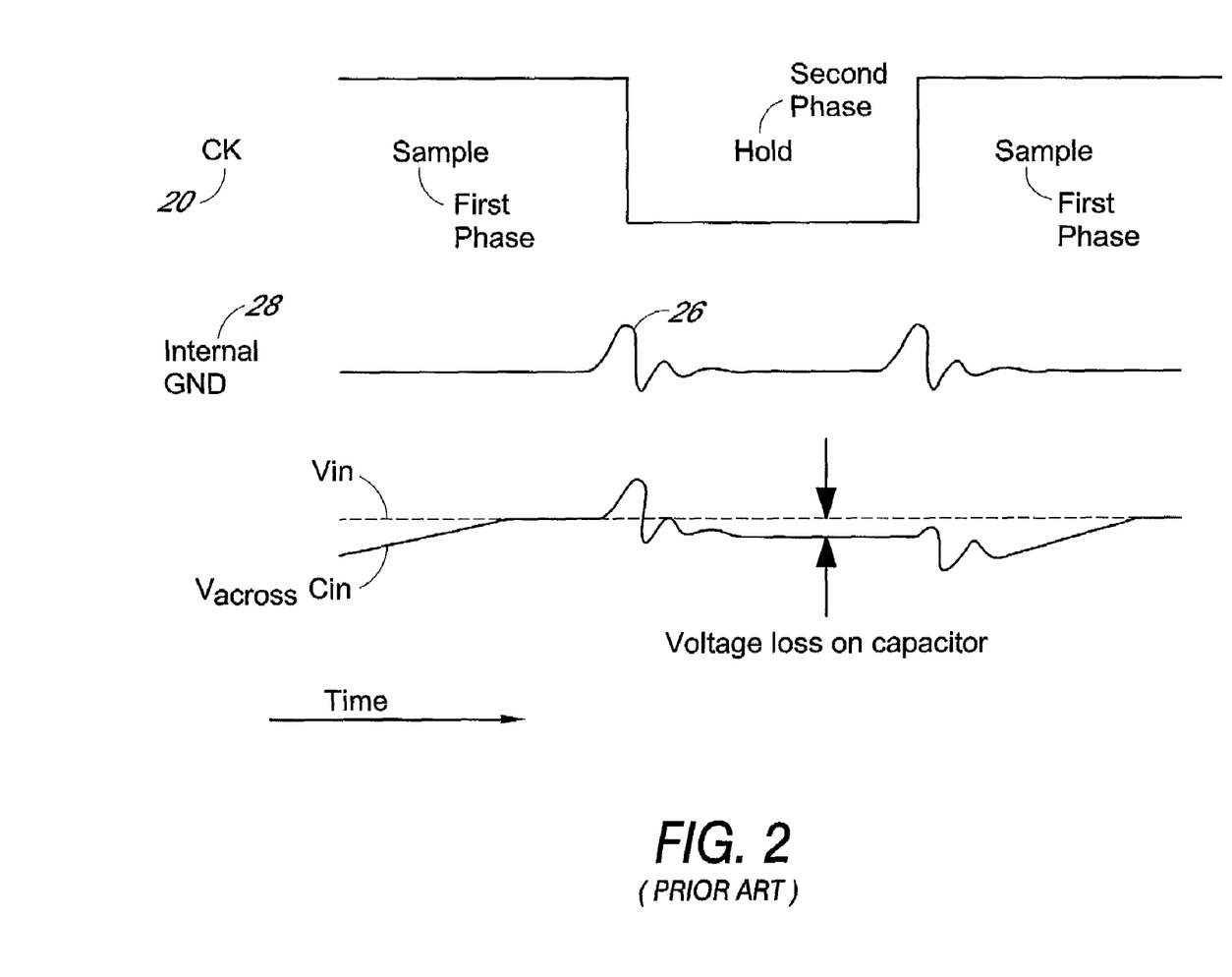
FIG. 2 illustrates the degradation of the sampled signal during the transition from the sample phase to the hold phase for the conventional switched capacitor structure shown in FIG. 1.

Operation of the conventional switched capacitor input structure illustrated in FIG. 1 is shown in FIG. 2. FIG. 2 illustrates the degradation of the sampled signal during the transition from the sample phase to the hold phase for the conventional switched capacitor structure shown in FIG. 1. FIG. 2 illustrates the clock signal 20, the internal ground voltage 28 (relative to external ground 27), the input voltage $V_{in}$ 12 relative to 27, and the voltage measured across the input capacitor $C_{in}$ 14 (relative to internal ground 28) as a function of time. During a sample phase, the clock signal 20 closes switch 16 which allows the input capacitor 14 to sample $V_{in}$ 12. During the sample phase, the voltage across the input capacitor 14 increases up to a value of $V_{in}$ 12. At some time after the capacitor voltage reaches $V_{in}$, the clock signal 20 opens switch 16. Opening switch 16 presents an open circuit to capacitor 14. However, any variations in the internal ground voltage 28, during the time when the switch 16 is opening, can cause voltage to be lost across the input capacitor 14. This loss in voltage can corrupt the signal that is subsequently measured across the input capacitor 14. For example, as shown in FIG. 2, the ground bounce 26 in the internal ground voltage 28 near the transition point from the sample phase to the hold phase manifests itself as a perturbation in the voltage measured across the input capacitor 14. This condition results in a voltage loss on capacitor 14 which is then transferred to the next stage of circuitry (not shown). After the voltage across the input capacitor 14 is sensed, the clock signal closes switch 16, which then allows the capacitor 14 to charge back up to $V_{in}$ 12.

Ground bounce is often caused by variations between an internal ground voltage and an external ground voltage. For example, when the sampled signal is from an off-chip external source and is measured on-chip. Variations between the on-chip ground potential and the off-chip ground potential can result in ground bounce. Ground bounce can occur randomly or periodically in response to on-chip digital activity. However, the limitations described above with respect to a conventional switched capacitor input structure can also be present when the sampled signal is derived on-chip. In such a case, spurious noise due to on-chip activity can result in charge loss during the transition from the sample phase to the hold phase.

Figure 3:
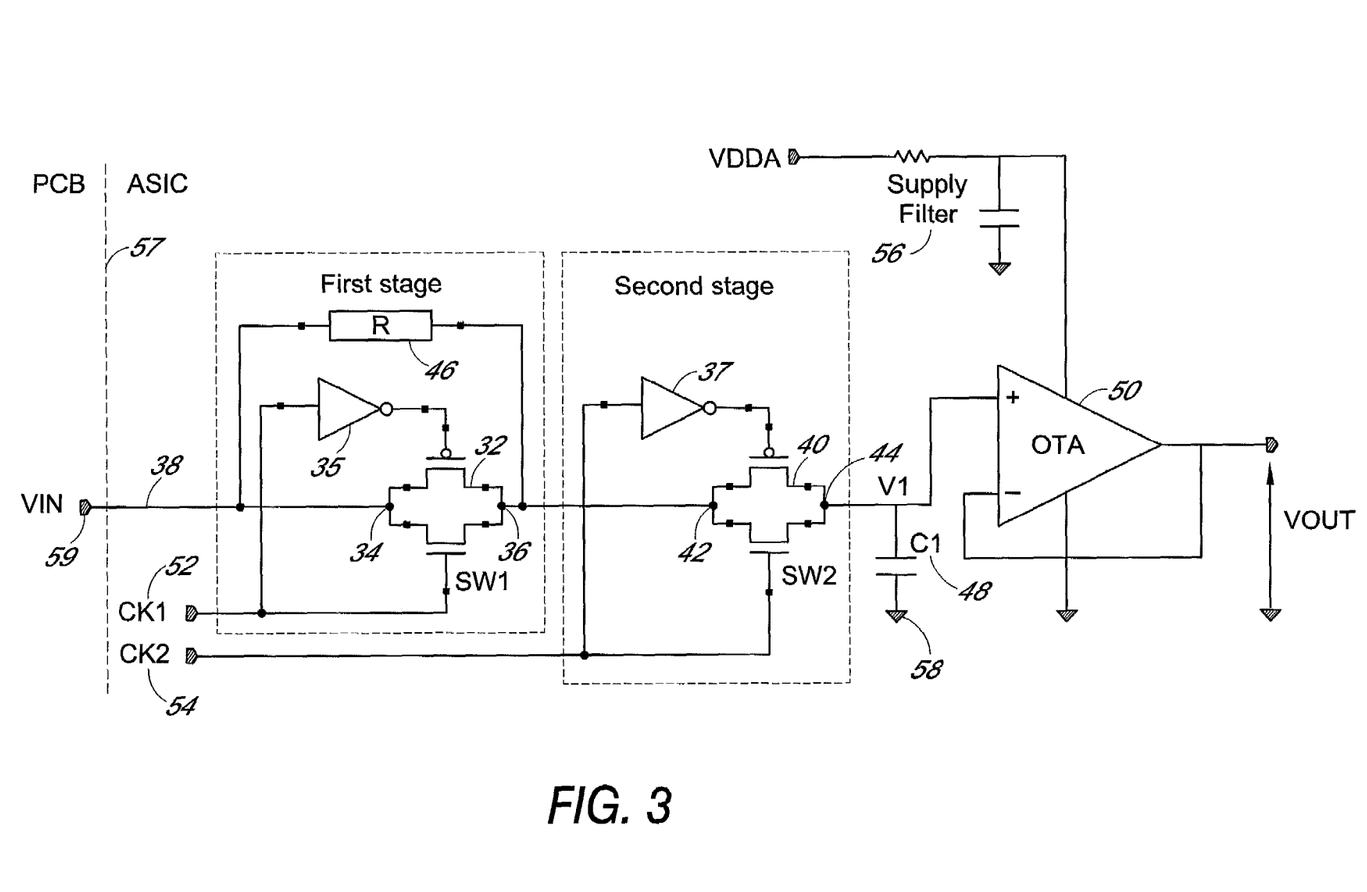
FIG. 3 is a block diagram of an first embodiment of a multi-phase sample and hold circuit which overcomes the limitations of the conventional switched capacitor structure shown in FIG. 1.

FIG. 3 is a block diagram of a first embodiment of a multi-phase sample and hold circuit which overcomes the limitations of the conventional switched capacitor structure shown in FIG. 1. The sample and hold circuit of FIG. 3 includes a first switch 32. The first switch 32 includes two terminals 34, 36. Terminal 34 is connected to a signal input line 38. The signal to be sampled originates from the signal input line 38. The sample and hold circuit of FIG. 3 further includes a second switch 40. The second switch 40 includes two terminals 42, 44. Terminal 42 is connected to terminal 36 of the first switch 32. A resistor 46 is connected between the signal input line 38 and the terminal 36 from the first switch 32. In the embodiment shown in FIG. 3, the resistor 46 is connected in parallel with the first switch 32. This configuration provides a signal path from the second switch 40 to the signal input line 38 which bypasses the first switch 32.

The first and second switches 32, 40 may include at least one transistor. Each transistor is configured to alternate between electrically connecting and disconnecting the switch's input from the switch's output. A clock signal 52 turns the first switch 32 off and on. While a clock signal 54 turns the second switch 40 off and on.

In the embodiment shown in FIG. 3, the first and second switches 32, 40 each include a pmos transistor and an nmos transistor. Coupled to each of the first and second switches 32, 40 are signal inverters 35, 37. Each signal inverter 35, 37 is configured to invert the incoming clock signal 52, 54 for one of the two transistors so as to allow both the pmos and nmos transistors to turn off and on in unison. A controller (not shown) provides the clock signal 52 and the clock signal 54 to operate the first switch 32 and the second switch 40, respectively. Alternatively, multiple controllers could be used. The sample and hold circuit of FIG. 3 further includes a hold capacitor 48 as described above.

In the embodiment of the sample and hold circuit shown in FIG. 3, an operational amplifier 50 is coupled to the terminal 44 of the second switch 40. The operational amplifier 50 is configured to act as a signal buffer. While the operational amplifier 50 is not required in the sample and hold circuit of FIG. 3, it has been added for illustrative purposes. The addition of the operational amplifier 50 in conjunction with a supply filter 56 provides additional noise immunity to hold capacitor 48. An exemplary operational amplifier 50 is an operational transconductance amplifier (OTA).

In the sample and hold circuit of FIG. 3, at least two switches are used to capture the signal input line 38. This configuration is in contrast to the conventional switched capacitor input structure represented by FIG. 1. As shown in FIG. 1, only a single switch is used between the input signal and the hold capacitor 12. The operation of the sample and hold circuit illustrated in FIG. 3 will now be described with reference to FIGS. 3 and 4.

Figure 4:
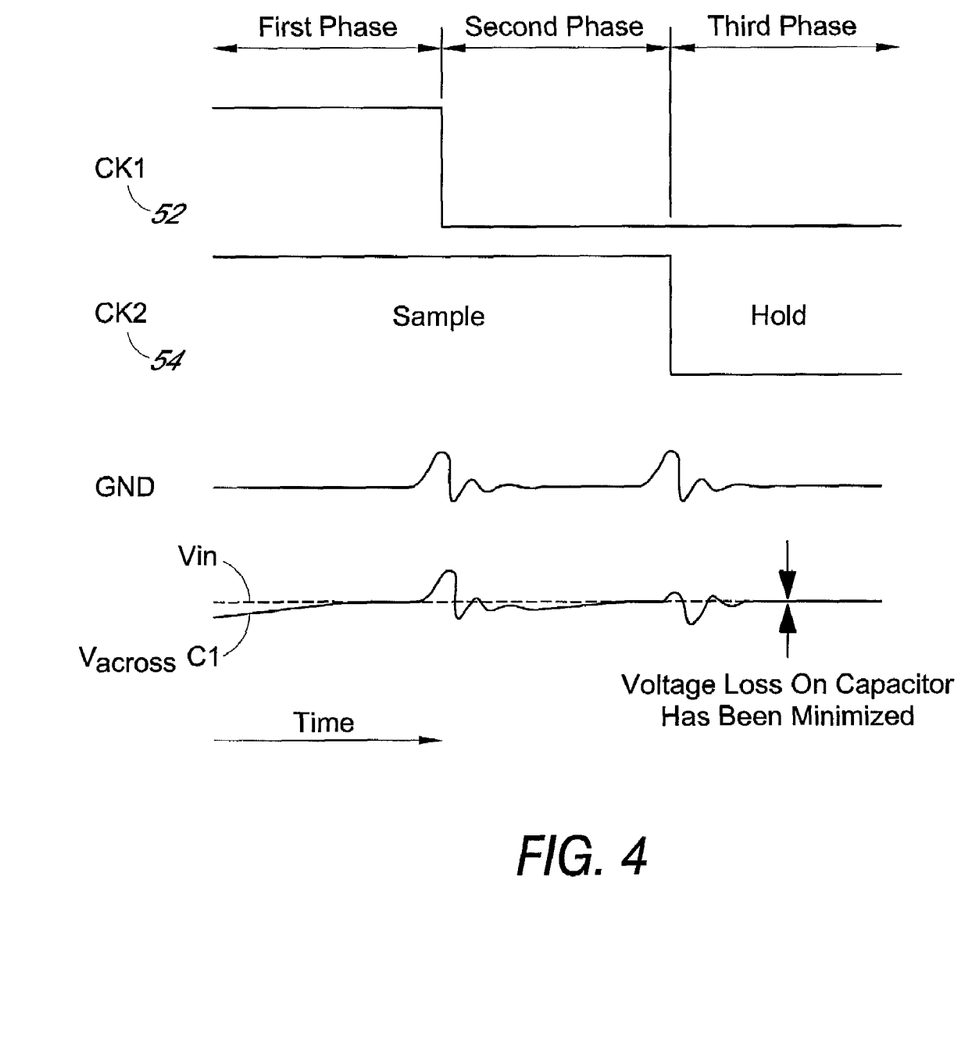
FIG. 4 illustrates the operation of the multi-phase sample and hold circuit shown in FIG. 3.

FIG. 4 illustrates the operation of the sample and hold circuit shown in FIG. 3. As explained above, the first and second switches 32, 40 are controlled by the controller via clock signals 52, 54. By utilizing two clock signals independently, the controller operates the sample and hold circuit in three distinct phases. The duration of time associated with each phase shown in FIG. 4 can be varied.

In the first phase shown in FIG. 4, clock signal 52 and clock signal 54 are asserted to close the switch 32 between the terminals 34 and 36. Similarly, the asserted clock signal 54 closes the switch 40 between the terminals 42 and 44. The closed switches cause the $V_{in}$ 59 via the signal input line 38 to be sampled on the hold capacitor 48.

In the second phase, clock signal 52 goes low while the clock signal 54 remains high. More specifically, the now opened switch 32 causes the resistor 46 to be placed in series with the hold capacitor 48 and the switch 40.

As shown in FIG. 4, the hold capacitor 48 can recharge during the second phase should the charge loss occur during the transition from the first phase to the second. The amount of recharge by the hold capacitor 48 depends on the resistance of the resistor 46 and the time in the second phase. It will be appreciated, however, that significant capacitor recharge need not occur for the benefits of the invention to be realized, as the presence of the resistor helps limit charge loss during the switching process itself. Moreover, the duration of the second phase can be selected so as to control the amount of recharge that occurs during the second phase.

The third phase of the sample and hold circuit occurs when the clock signal 54 is driven low. More specifically, the clock signal 54 opens the switch 40 between the terminals 42 and 44. The opened switch 40 presents an open circuit to the hold capacitor 48. Any charge loss from the hold capacitor 48 into the signal input line 38 during the transition from the second phase to the third phase is minimized by the high input resistance introduced by the resistor 46. The methods and systems so described minimize the voltage loss on the capacitor 48 during the third phase as shown in FIG. 4.

Figure 5:
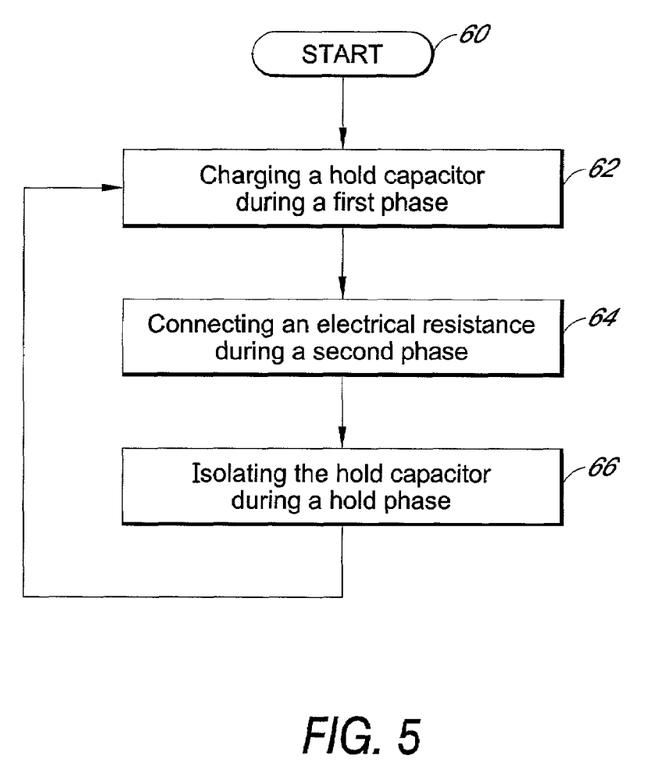
FIG. 5 is a flow chart of an exemplary process that is performed by the sample and hold circuit shown in FIG. 3.

FIG. 5 is a flow chart of an exemplary process that is performed by the sample and hold circuit shown in FIG. 3. As explained above, the controller provides the clock signals to the switches of the sample and hold circuits. The process begins at a state 60 and proceeds to a state 62 where the hold capacitor 48 is charged during a first phase.

During the first phase, clock signal 52 and clock signal 54 are set high. More specifically, the clock signal 52 closes the switch 32 between the terminals 34 and 36. Similarly, the clock signal 54 closes the switch 40 between the terminals 42 and 44. The closed switches cause the $V_{in}$ 59 via the signal input line 38 to be sampled on the hold capacitor 48. This configuration provides a low resistance path through the two switches 32, 40. This low resistance path allows charge to flow into hold capacitor 48 until the voltage across the hold capacitor 48 reaches $V_{in}$ 59. The process moves to a state 64 where the resistor 46 is connected between the input voltage from the input signal source 38 and the second switch 40.

During the second phase, clock signal 52 is forced low. More specifically, the clock signal 52 opens the switch 32 between terminals 34 and 36. The opened switch 34 causes the resistor 46 to be placed in series with the hold capacitor 48. Any charge loss on the hold capacitor 48 during the second phase is discharged into the signal input line 38 via the resistor 46. As explained above, charge loss can be caused by, for example, chip ground noise. Flow moves to a state 66 where the controller drives clock signal 54 low, resulting in an open circuit between the hold capacitor 48 and the input signal source 38.

During the third phase, the hold capacitor 48 is electrically isolated from the input voltage $V_{in}$ 59 associated with the input signal source 38. Phase three results from driving the clock signal 54 low. More specifically, the clock signal 54 opens the switch 40 between the terminals 42 and 44. Since the hold capacitor 48 is isolated from the input signal, the high input resistance introduced by the resistor 46 minimizes any charge loss from the hold capacitor 48 during the transition from the second phase to the third phase. The charge loss from the hold capacitor 48 would have to pass through the resistor 46. The opened switch 40 effectively presents an open circuit to the hold capacitor 48. Once the capacitor 48 has been isolated from the input voltage associated with the signal input line 38, the voltage across the capacitor 48 can be measured by a next stage of circuitry (not shown). The methods and systems so described minimize the voltage loss on the hold capacitor 48 during the transition from the third phase to the fourth phase.

The process then returns to state 62 where the controller drives clock signal 52 and clock signal 54 high which once again allows the hold capacitor 48 to charge up to the input voltage associated with the input signal line 38. Flow then proceeds as described above.

In additional embodiments, the semiconductor chip can include a plurality of sample and hold circuits. Each sample and hold circuit includes a first switch, a resistor, and a second switch, all as described with reference to FIG. 3. In one embodiment, eight sample and hold circuits are included on the semiconductor chip. The semiconductor chip is configured to receive a plurality of input signals. Each input signal is routed to one of the plurality of sample and hold circuits on the semiconductor chip. Each sample and hold circuit further connects with a hold capacitor. In turn, the outputs from the plurality of sample and hold circuits are provided to the hold capacitor. Thus, over time, the hold capacitor is utilized by more than one sample and hold circuit.

Figure 6:
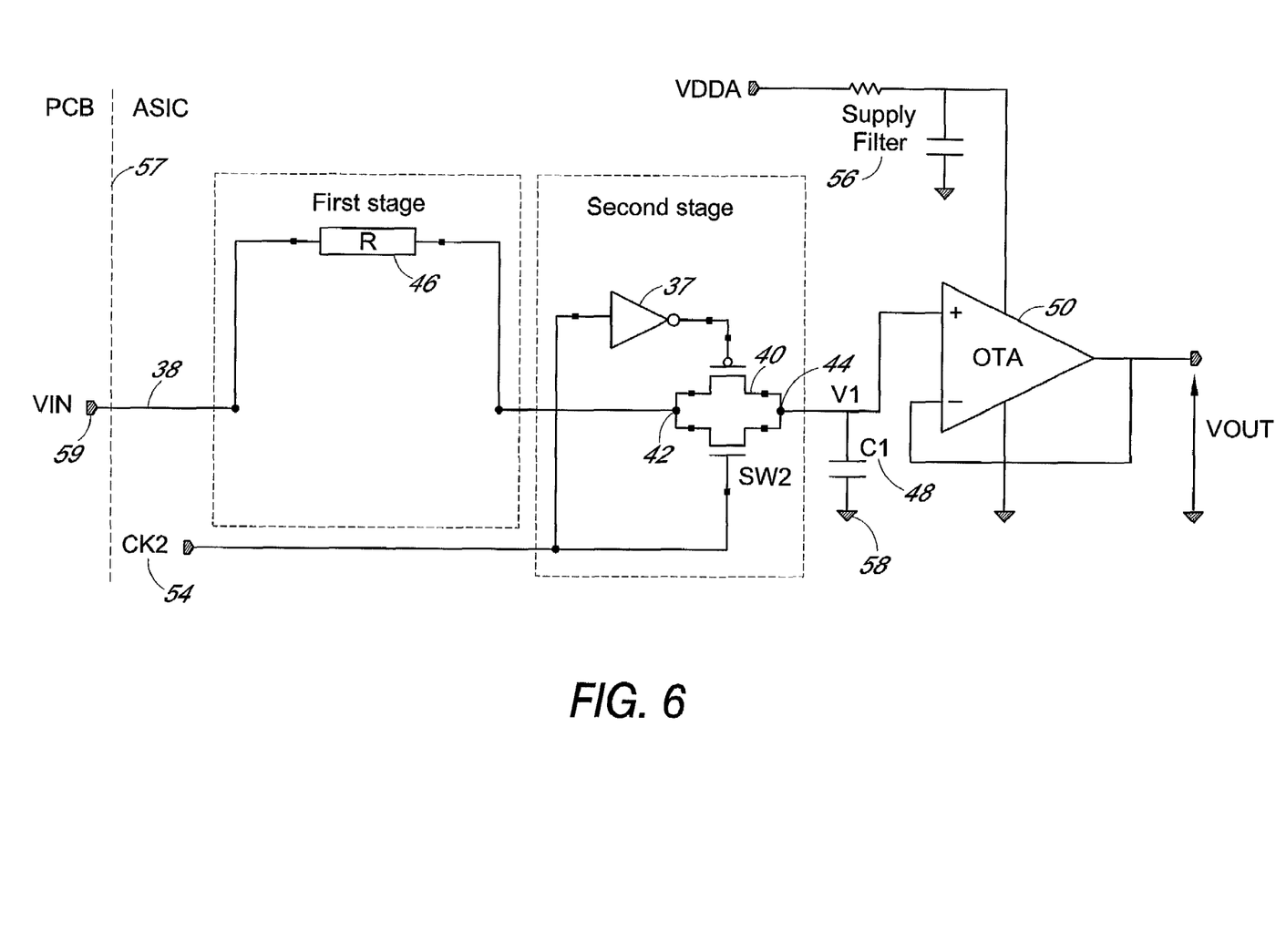
FIG. 6 is a block diagram of a second embodiment of a multi-phase sample and hold circuit configured for low speed applications.

FIG. 6 is a block diagram of a second embodiment of a multi-phase sample and hold circuit. The sample and hold circuit of FIG. 6 is especially advantageous in low speed applications. Operation of the second embodiment is explained with reference to FIG. 7. The sample and hold circuit of FIG. 6 includes the same components as the sample and hold circuit shown in FIG. 3 except that the first switch 34 has been removed. All of the components are configured as described with reference to FIG. 3.

The controller (not shown) provides the clock signal 54 to operate the second switch 40. Clock signal 54 alternates the second switch 40 between providing an opened circuit or a closed circuit between terminal 42 and terminal 44. As will be explained below, the clock signal 54 provided by the controller operates the sample and hold circuit of FIG. 6 in two distinct phases.

Figure 7:
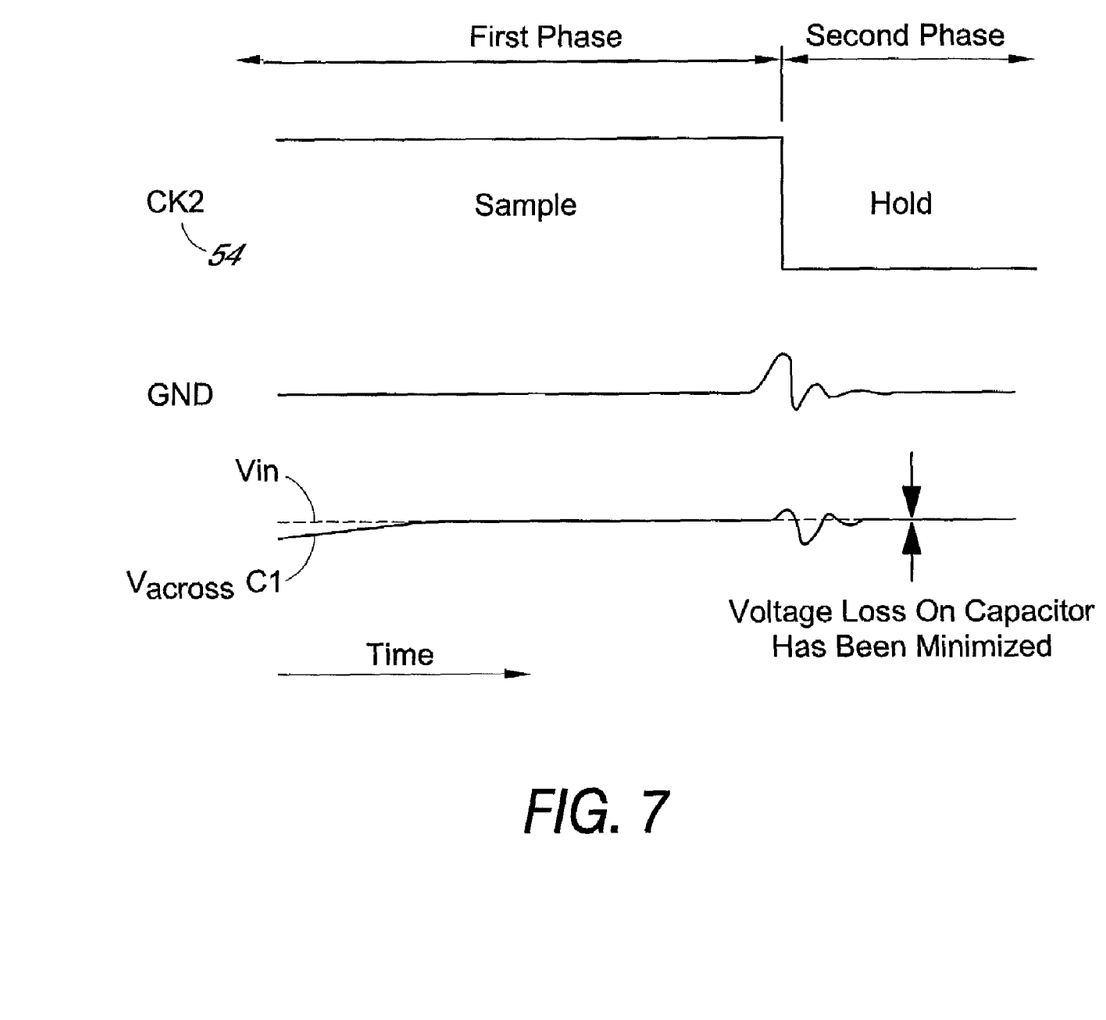
FIG. 7 illustrates the operation of the multi-phase sample and hold circuit shown in FIG. 6.

FIG. 7 illustrates the operation of the multi-phase sample and hold circuit shown in FIG. 6. As explained above, the controller, via clock signal 54, controls the second switch 40. By utilizing one clock signal, the controller operates the sample and hold circuit in two distinct phases. The duration of time associated with each phase shown in FIG. 7 can be varied.

During the first phase clock signal 54 is forced high. More specifically, the clock signal 54 closes the switch 40 between terminals 42 and 44. The closed switch 40 provides a high resistance path between the signal input line 38 and the terminal 44. This path includes the resistor 46 which is in series with the hold capacitor 48. Any charge loss on the hold capacitor 48 during the first phase is discharged into the signal input line 38 via the resistor 46. As explained above, charge loss can be caused by, for example, chip ground noise.

As shown in FIG. 7, the hold capacitor 48 can recharge during the first phase should the charge loss occur during the transition from the previous second phase to the first phase. However, since the hold capacitor 48 does not see an open circuit to the signal input line 38, the hold capacitor 48 requires additional time to reach $V_{in}$ 59 during the first phase. This is in contrast to the sample and hold circuit of FIG. 3. The amount of recharge achieved by the hold capacitor 48 depends on the resistance of the resistor 46 and the time in the first phase. Thus, the sample and hold circuit of FIG. 6 is suited for low speed operation. The resistor 46 in this application may be included on or off-chip.

The third phase of operation for the sample and hold circuit of FIG. 7 occurs when the clock signal 54 is driven low. More specifically, the clock signal 54 opens the switch 40 between the terminals 42 and 44. The opened switch 40 presents an open circuit to the hold capacitor 48. Any charge loss from the hold capacitor 48 into the signal input line 38 during the transition from the second phase to the third phase is minimized by the high input resistance introduced by the resistor 46. The methods and systems so described minimize the voltage loss on the capacitor 48 during the third phase as shown in FIG. 7. As will be obvious to one skilled in the art, the first embodiment of the sample and hold circuit shown in FIG. 3 can be operated as described in FIG. 7 by leaving the clock signal 52 low. By leaving the clock signal 52 low the first switch 34 stays open.

The foregoing description details certain preferred embodiments of the present invention and describes the best mode contemplated. It will be appreciated, however, that no matter how detailed the foregoing appears in text, the invention can be practiced in many ways. As is also stated above, it should be noted that the use of particular terminology when describing certain features or aspects of the present invention should not be taken to imply that the terminology is being re-defined herein to be restricted to including any specific characteristics of the features or aspects of the invention with which that terminology is associated. The scope of the present invention should therefore be construed in accordance with the appended claims and any equivalents thereof.

What is claimed is:

1. A sample and hold circuit comprising:
   a first switch comprising two terminals, one of which is connected to a signal input line;
   a second switch comprising two terminals, one of which is connected to the other terminal of the first switch;
   an operational amplifier having an input terminal connected to the other terminal of the second switch;
   a resistor interposed between the signal input line and the other terminal of the first switch;
   a hold capacitor interposed between the input terminal of the operational amplifier and a constant-potential line; and
   a controller configured to operate said first and second switches during a first phase, a second phase, and a third phase, such that during the first phase the hold capacitor samples a voltage associated with the signal input line, during the second phase the first switch presents an open circuit across the resistor, and during the third phase the second switch presents an open circuit to the hold capacitor.

2. A circuit configured to maintain an input signal, the circuit comprising:
   a first switch connected to receive the input signal;
   a resistor located in parallel with the first switch;
   a second switch in series with the first switch;
   a hold capacitor in communication with the second switch and configured to sample the input signal; and
   a logic circuit configured to periodically:
      route the input signal to the hold capacitor via the first and second switches during a first sample phase,
      route the input signal to the hold capacitor via the resistor and the second switch during a second sample phase, and
      isolate the hold capacitor from the input signal during a hold phase.

* * * * *